United States Patent [19]

Hanawa et al.

[11] Patent Number: 5,051,699
[45] Date of Patent: Sep. 24, 1991

[54] MAGNETIC RESONANCE IMAGING SYSTEM

[75] Inventors: Masatoshi Hanawa; Kazuto Nakabayashi, both of Ootawara, Japan

[73] Assignee: Kabushiki Kaisha Toshiba, Kawasaki, Japan

[21] Appl. No.: 400,059

[22] Filed: Aug. 29, 1989

[30] Foreign Application Priority Data

Aug. 31, 1988 [JP] Japan .................................. 63-214919
Sep. 20, 1988 [JP] Japan .................................. 63-235324

[51] Int. Cl.⁵ ........................................... G01R 33/20
[52] U.S. Cl. .................................................... 324/309
[58] Field of Search ................. 324/309, 307, 312, 314

[56] References Cited

U.S. PATENT DOCUMENTS 4,689,568 8/1987 Matsui et al. ......................... 324/309
4,833,407 5/1989 Holland et al. ....................... 324/309

OTHER PUBLICATIONS

Bruce Barker, "Chemical Shift Artifact in Non-Spectroscopic NMR Imaging", Book of Abstracts: Society of Magnetic Resonance in Medicine, 1984, pp. 34–35.
W. Thomas Dixon, Ph.D. "Simple Proton Spectroscopic Imaging", Radiography, 1984; 153: 189–194.

Primary Examiner—Hezron E. Williams
Assistant Examiner—Louis M. Arana
Attorney, Agent, or Firm—Foley & Lardner

[57] ABSTRACT

A magnetic resonance imaging system includes a static magnetic field generating section, a gradient magnetic field applying section, an RF pulse applying section, a sequence control section, a receiving section, and an imaging processing section. The sequence control section causes an RF pulse to excite magnetic resonance, causes at least one of the RF pulse and the gradient field to produce an initial magnetic resonance echo, applies a read gradient field to the imaging volume upon reception of the magnetic resonance echo, and inverts the read gradient field at least once to produce at least one magnetic resonance echo in addition to the initial magnetic resonance echo. The receiving section adds and averages data of a plurality of such magnetic resonance echoes or performs an addition or subtraction of the magnetic resonance echoes.

14 Claims, 7 Drawing Sheets

MAGNETIC RESONANCE IMAGING SYSTEM

BACKGROUND OF THE INVENTION

1. Field of the Invention

The present invention relates to a magnetic resonance imaging (MRI) system for applying a gradient magnetic field and an RF pulse to an object to be examined which is placed in a static magnetic field so as to excite magnetic resonance at a specific portion of the object, and acquiring magnetic resonance (MR) echo signals excited by the magnetic resonance, thereby imaging the specific portion by a predetermined image reconstruction method using data based on the acquired MR echo signals and, more particularly, to an improvement of an MR echo signal data acquisition sequence for preventing an artifact caused by a chemical shift, increasing an S/N (Signal-to-Noise ratio), and images separated by the chemical shift.

2. Description of the Related Art

In a general medical MRI system, a gradient magnetic field and an RF pulse are applied to an object to be examined which is placed in a static magnetic field in accordance with a predetermined sequence for magnetic resonance excitation/MR data acquisition so as to cause an MR phenomenon at a specific portion of the object, and an MR signal excited by the MR phenomenon is detected. In addition, according to the system, data processing for imaging which includes image reconstruction is performed for MR data acquired in this manner so as to image anatomical information or quality information of the specific portion of the object.

An MRI system of this type generally comprises a static magnetic field generator, X-axis, Y-axis, and Z-axis gradient magnetic field generators, an RF transmitter, and an RF receiver. The X-axis, Y-axis, and Z-axis gradient magnetic field generators and the RF transmitter are driven in accordance with a predetermined sequence so as to generate X-axis, Y-axis, and Z-axis gradient magnetic fields Gx, Gy, and Gz and an RF pulse in accordance with a predetermined sequence pattern. As a result, magnetic resonance is excited to generate an MR signal, and the MR signal is received by the receiver. Predetermined image processing including image reconstruction processing such as the two-dimensional Fourier transform is performed for the received MR data. In this manner, a tomographic image of a certain slice portion of an object to be examined is generated and displayed on a monitor.

In the sequence for magnetic resonance excitation/MR data acquisition, the X-axis, Y-axis, and Z-axis gradient magnetic fields Gx, Gy, and Gz are respectively used as, e.g., a read gradient magnetic field Gr, an encode gradient magnetic field Ge, and a slicing gradient magnetic field Gs.

One of the conventional MRI methods widely used in such a system is an imaging method employing the sequence of the SE method which uses 90°–180° series RF pulses. According to the sequence of the SE method, data acquisition can be performed by a multi-echo sequence in which a plurality of MR echoes are sequentially generated upon one MR excitation and the respective data are sequentially acquired. This SE method is often used for MR data acquisition using the multi-echo sequence.

Figure 1:
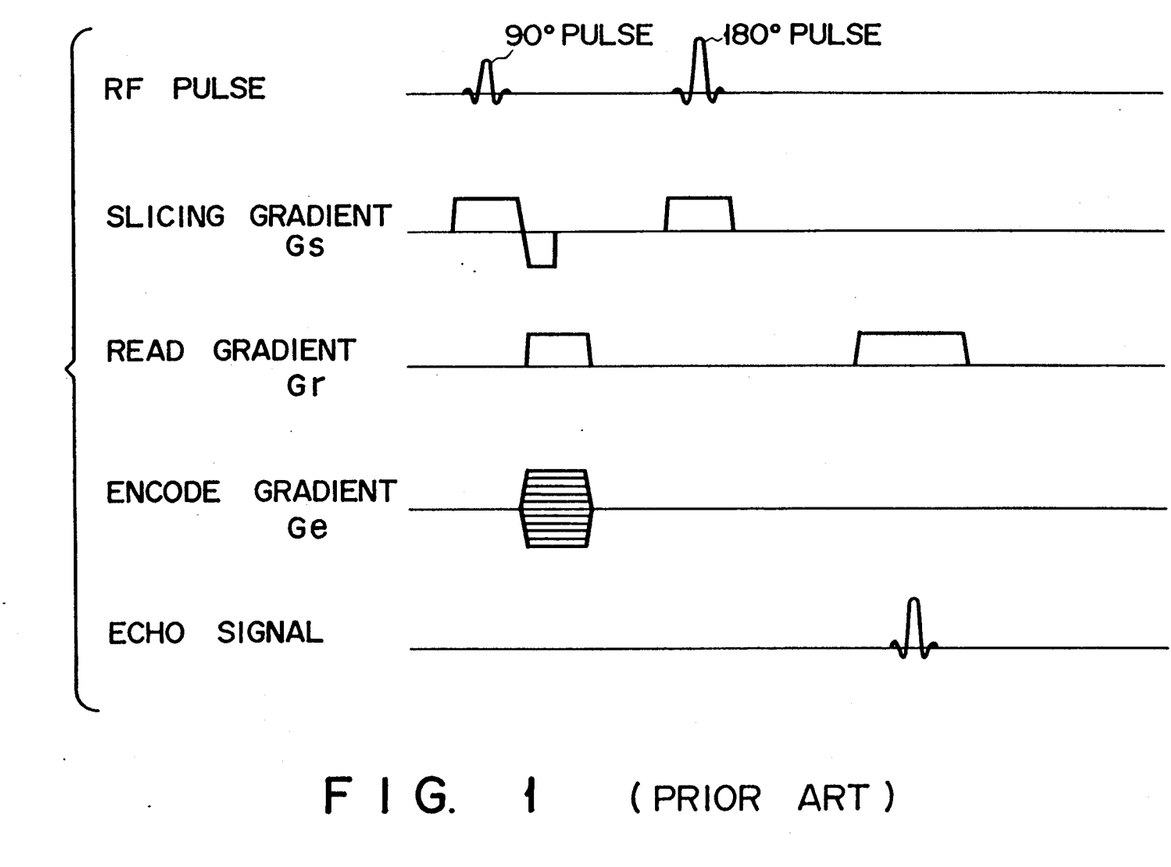
FIG. 1 is a timing chart showing a pulse sequence in a conventional MRI system.

The sequence of such a conventional SE method will be described below with reference to FIG. 1. FIG. 1 shows a sequence in one encode step.

A slicing gradient magnetic magnetic field Gs and a 90° selective excitation pulse as an RF magnetic field are applied to an object to be examined so as to excite a specific slice of the object by flipping the magnetization vector (to be referred to as "nuclear magnetization" hereinafter) of the nuclear spin of a specific atomic nucleus in the slice through 90°. Thereafter, an encode gradient magnetic field Ge having an amplitude corresponding to the encode step is applied to the object, and a 180° pulse as an RF magnetic field is applied to the object so as to invert the nuclear magnetization, thereby rephasing and refocusing the rotational phase of the nuclear magnetization (which has been dephased and dispersed upon application of the 90° pulse). In addition, a read gradient magnetic field Gr is applied to the object to generate an MR echo signal whose peak appears after a TE time (echo time) from the peak of the 90° pulse. While the read gradient magnetic field Gr is applied to the object, the MR echo signal is acquired.

The above-described sequence is repeated while the amplitude of the encode gradient magnetic field Ge, which is applied between applications of 90° and 180° pulses, is changed by a predetermined value in every encode step. When the second and subsequent multi-echo signal data are to be acquired, an operation of applying a 180° pulse to the object after a time TE/2 from the peak of the immediately preceding echo signal and applying a read gradient magnetic field Gr to the object is repeated, thereby sequentially acquiring echo signals each having a peak appearing after a time TE/2 from the peak of each 180° pulse while the read gradient field Gr is being applied.

In an MRI system of the type described above, in order to prevent the artifact based on chemical shift (i.e., typically chemical shift between water and fat associated with protons ($^1$H)), the strength of the I gradient field Gr is increased to satisfy the following inequality (See, Bruce Barker, "Chemical Shift Artifact In Non-Spectroscopic NMR Imaging", Book of Abstracts: Society of Magnetic Resonance in Medicine, 1984, pp. 34–35):

$$\gamma \cdot Gr \cdot \Delta l \geq \delta \cdot \gamma \cdot B0$$

(where $\gamma$ is the gyromagnetic ratio, $\Delta l$ is the resolution, $\delta$ is the ohemical shift between water and fat, i.e., chemical shift of the fat, and B0 is the static field strength).

However, with this method, a frequency band $\Delta f$ within one pixel is increased, and a noise component N is increased as follows:

$$\Delta f = \gamma \cdot Gr \cdot \Delta l$$

$$N \propto \sqrt{\Delta f}$$

SUMMARY OF THE INVENTION

It is an object of the present invention to provide an MRI system capable of preventing artifacts caused by chemical shift and obtaining an image having a high S/N.

In an MRI system according to the present invention, after magnetic resonance is excited and the phase of the nuclear magnetization of the resonance spin is rephased or refocused, the polarity of the read gradient field is inverted a plurality of times with a lapse of time, thereby acquiring a plurality of MR echo signals. The plurality of echo signals are added and averaged in frequency space, and a single echo signal data having a high S/N ratio can be obtained. By properly adjusting the polarity inversion timings of the read gradient fields, two types of magnetic resonance echo signals are sequentially obtained in which phase differences of nuclear magnetization components of two substances having slightly different magnetic resonance frequencies caused by chemical shift are 90° and 180°.

Even if the strength of the read gradient field Gr is increased to prevent the chemical artifacts, a plurality of MR echo signals can be acquired within a repetition time of data acquisition. The plurality of MR echo signals are added and averaged in the frequency space to obtain one MR echo signal data, thereby increasing the S/N ratio. In addition, two types of magnetic resonance echo signals for obtaining a separated image of the two substances (i.e., at least one of the separated images in units of substances) having slightly different resonance frequencies caused by chemical shift can be obtained within the repetition time of the data acquisition. Therefore, the separated images can be easily obtained.

DETAILED DESCRIPTION OF THE PREFERRED EMBODIMENT

An MRI system according to a first embodiment of the present invention will be described with reference to FIGS. 2 to 4C.

Figure 2:
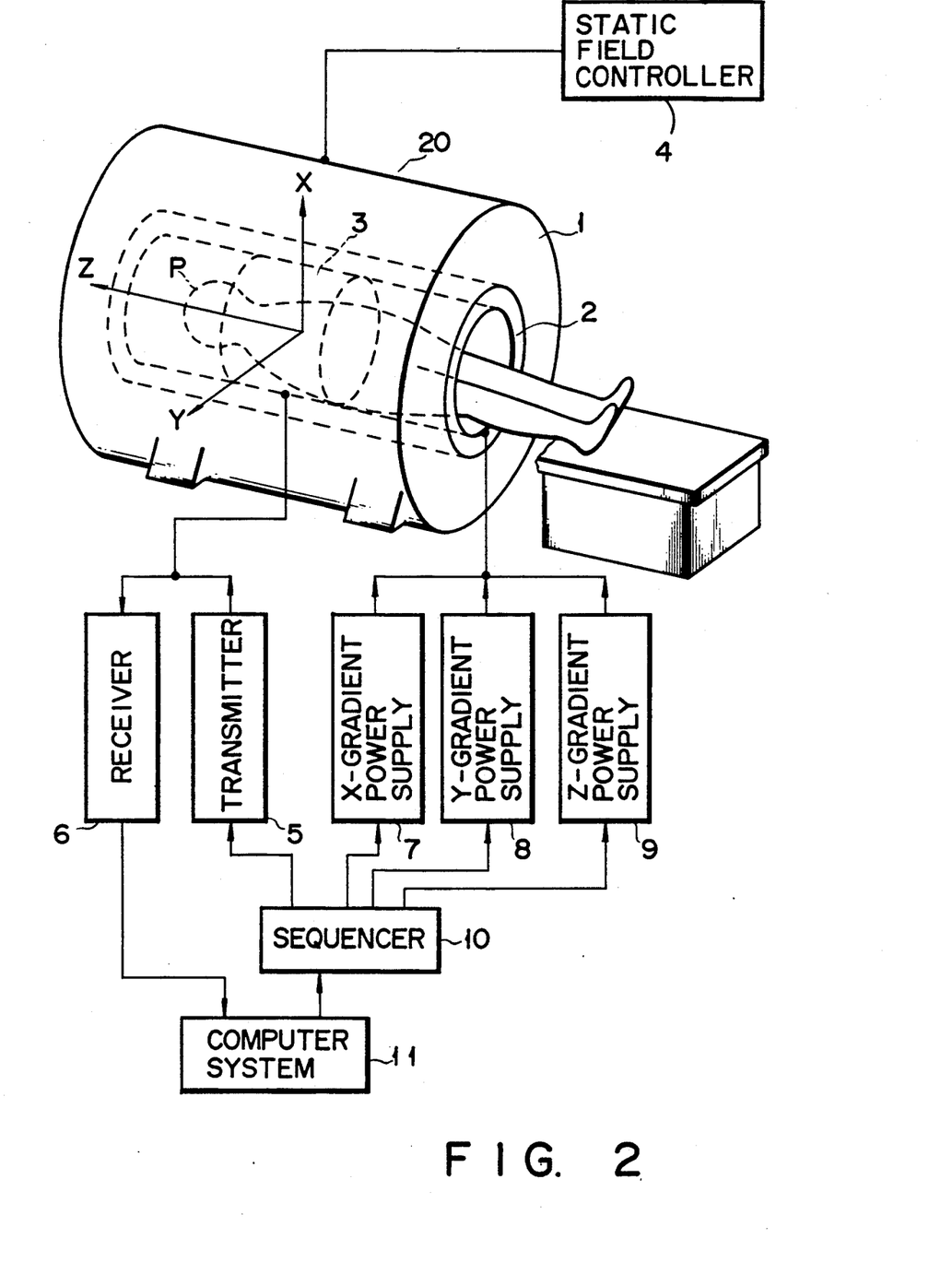
FIG. 2 is a block diagram showing an arrangement of an MRI system according to a first embodiment of the present invention.

A static field magnet 1, X-axis, Y-axis, and Z-axis gradient magnetic field coils 2, and a transmitting-/receiving coil 3 are arranged in a gantry 20. The static field magnet 1 as a static field generator is constituted by, e.g., a superconductive coil or a normal conductive coil. The X-axis, Y-axis, and Z-axis gradient magnetic field coils 2 are coils for respectively generating X-axis, Y-axis, and Z-axis gradient magnetic fields Gx, Gy, and Gz. The transmitting/receiving coil 3 is used to generate an RF pulse and receive an MR signal generated by MR. An object (patient) P to be examined is inserted in an imaging allowable volume (a spherical volume in which an imaging magnetic field is formed, so that a medical diagnosis can be performed within only the spherical volume) in the gantry 20.

The static field magnet 1 is driven by a static field controller 4. The transmitting/receiving coil 3 is driven by a transmitter 5 when MR is excited, and is coupled to a receiver 6 when an MR signal is detected. The X-axis, Y-axis, and Z-axis gradient magnetic field coils 2 are respectively driven by X-, Y-, and Z gradient power supplies 7, 8, and 9.

The X-, Y-, and Z-gradient power supplies 7, 8, and 9, and the transmitter 5 are driven by a sequencer 10 in accordance with a predetermined sequence so as to respectively generate X-axis, Y-axis, and Z-axis gradient magnetic fields Gx, Gy, and Gz, and RF pulses of, e.g., 90°14 180° pulse series in accordance with a predetermined pulse sequence (to be described later). In this case, X-axis, Y-axis, and Z-axis gradient magnetic fields Gx, Gy, and Gz are mainly used as, e.g., a read gradient magnetic field Gr, an encode gradient magnetic field Ge, and a slicing gradient magnetic field Gs, respectively. A computer system 11 drives/controls the sequencer 10. In addition, the computer system 11 fetches a spin echo signal as an MR signal received by the receiver 6 and performs predetermined signal processing to generate a tomographic image of a specific slice portion of an object to be examined, thus displaying it on a display monitor.

A pulse sequence for MR excitation/MR data acquisition in the MRI system according to the first embodiment of the present invention will be described with reference to FIG. 3. A static field is statically applied by the static field magnet 1 driven by the static field controller 4 during execution of the sequence shown in FIG. 3.

Figure 3:
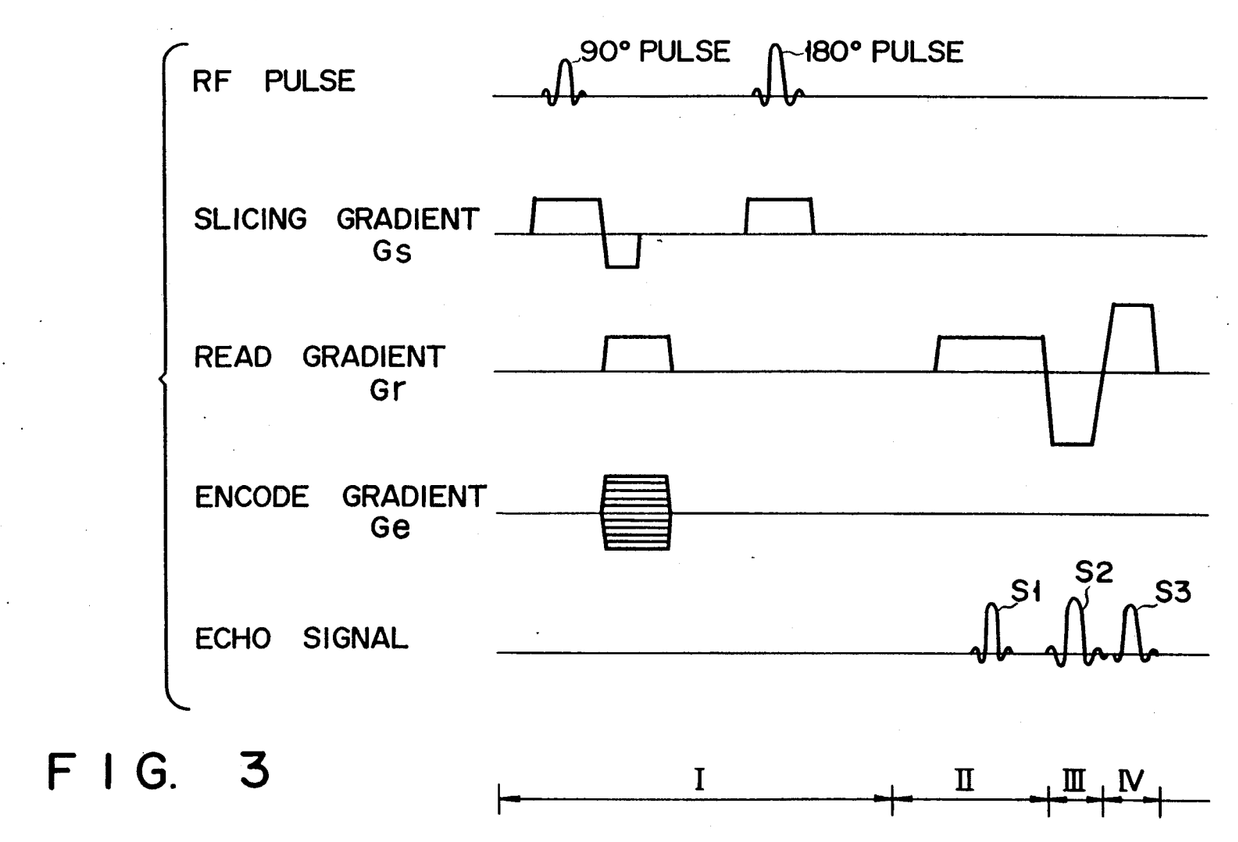
FIG. 3 is a view for explaining a pulse sequence of the system in FIG. 2 in detail.

A magnetic resonance is excited in a nuclear spin of a specific portion of the patient P by a 90° pulse as a selective excition pulse while a slicing gradient field Gs is being applied to the patient P during a time period I shown in FIG. 3. The read gradient field Gr is applied to the patient P to dephase the nuclear magnetization of the nuclear spin subjected to magnetic resonance excitation. An encode gradient field Ge having an amplitude corresponding to an encode step is applied to the patient P to perform phase encoding, and then the slicing gradient field Gs is applied. Under these conditions, a 180° selective excitation pulse is applied to invert the nuclear magnetization, thereby refocusing phase.

During a time period II, rephasing and dephasing are performed by the read gradient field Gr to acquire a first echo signal S1.

During a time period III, the polarity of the read gradient field Gr is inverted (in this case, negative) from that during the time period II, and an MR echo signal by the rephased nuclear spin, i.e., a second echo signal S2 is obtained. In this manner, MR echoes produced by inversion of the read gradient field Gr are obtained. These echoes are termed a gradient echo signal, a field echo signal, or a gradient field echo signal.

After the echo signal is produced by the rephased nuclear magnetization in the first half of the time period III, and the nuclear magnetization is dephased again in the second half of the time period III, the polarity of the read gradient field Gr is inverted (in this case, positive) to rephase the nuclear magnetization during a time period IV, thereby generating a third echo signal S3.

The sequence of time period I to IV is repeated while the amplitude of the encode gradient field Ge applied between the 90° and 180° pulses is changed through a range of predetermined values in units of the encode steps.

Figure 4A:
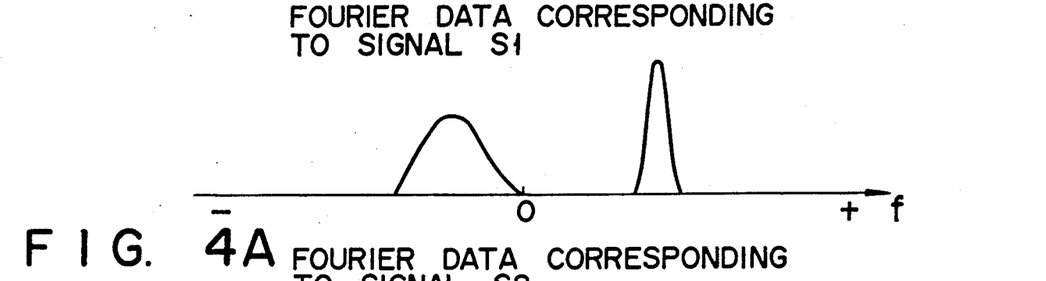
FIGS. 4A to 4C are views for explaining signal processing in the system of FIG. 2.
Figure 4B:
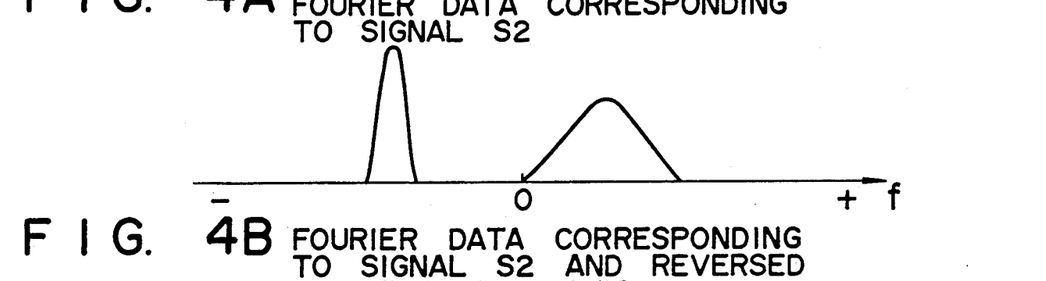

When the first to third echo signals S1 to S3 are Fourier-transformed, the first and second echo signals S1 and S2 are obtained, as shown in FIGS. 4A and 4B, respectively. More specifically, when the first echo signal S1 is given as shown in FIG. 4A, the second echo signal S2 is given as shown in FIG. 4B. As is apparent from FIGS. 4A and 4B, the first and second echo signals S1 and S2 are inverted on the frequency axis since they are read by the read gradient fields Gr having opposite polarities.

Figure 4C:
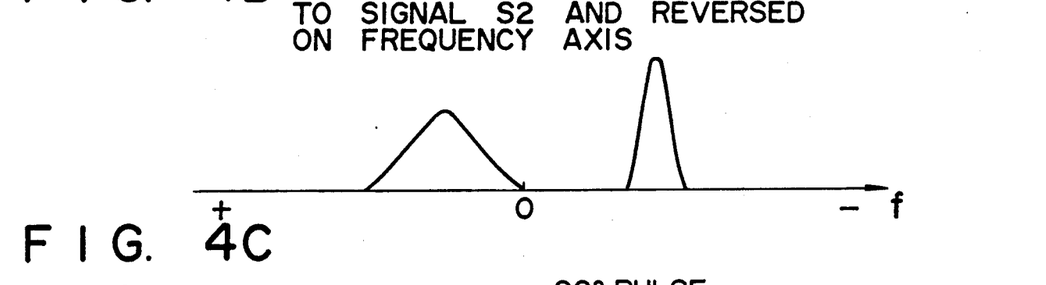

The second echo signal data shown in FIG. 4B is inverted on the frequency axis to data shown in FIG. 4C, and data E1, E2 (E1 and E2 are inverted on the frequency axis), and E3 of the first, second, and third echo signals S1, S2, and S3 are added and averaged in the frequency space. The resultant echo signal can be given as a signal S as follows:

$$S = (E1 + E2 + E3)/3$$

The noise component N is given by the equation $N = \sqrt{N_1^2 + N_2^2 + N_3^2}/3$ ($N_1$, $N_2$ and $N_3$ are noise components of $E_1$, $E_2$ and $E_3$, respectively). Therefore the S/N is improved by $\sqrt{3}$.

In this system, when the strengths of the gradient fields including the read gradient field Gr are set to be high, i.e., the amplitudes of these gradient fields are increased, generation of chemical shift artifacts can be prevented, and at the same time, an S/N can be increased.

The following effects can also be obtained in this system in addition to the above effects.

Since an S/N can be increased, thin slicing can be performed to result in accurate medical diagnoses. Since the chemical artifacts can be prevented, the resolution of the image can be improved.

A second embodiment of the present invention will be described with reference to FIG. 5.

Figure 5:
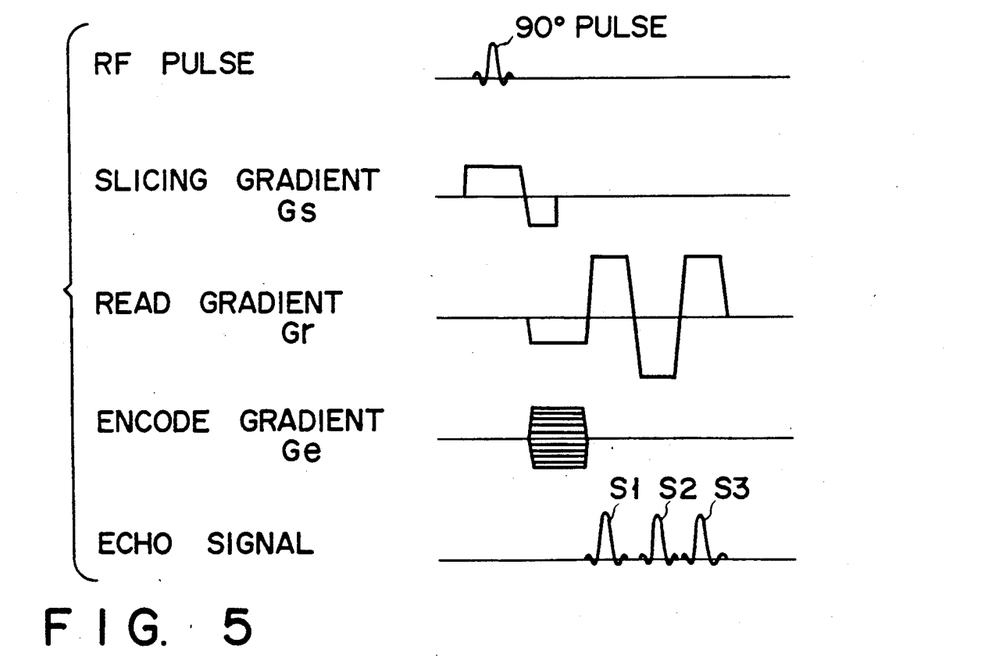
FIG. 5 is a view for explaining a pulse sequence of an MRI system according to a second embodiment of the present invention.

FIG. 5 shows the second embodiment in which a gradient echo method of inverting a read gradient field Gr is used in place of a spin echo method using a 180° pulse for refocusing the phase of nuclear magnetization. Unlike FIG. 3 in which the application times and strengths of the rephase and dephase read gradient fields Gr are set to be long and weak, in the first positive time interval, and are then short and strong in the next negative and subsequent positive time intervals, in FIG. 5, the application times and strengths of the rephase and dephase read gradient magnetic fields Gr are equal to those of the positive, negative, and positive gradient fields Gr for the first, second, and third echo signals S1, S2, and S3.

An MRI system according to a third embodiment of the present invention will be described with reference to FIG. 6.

Figure 6:
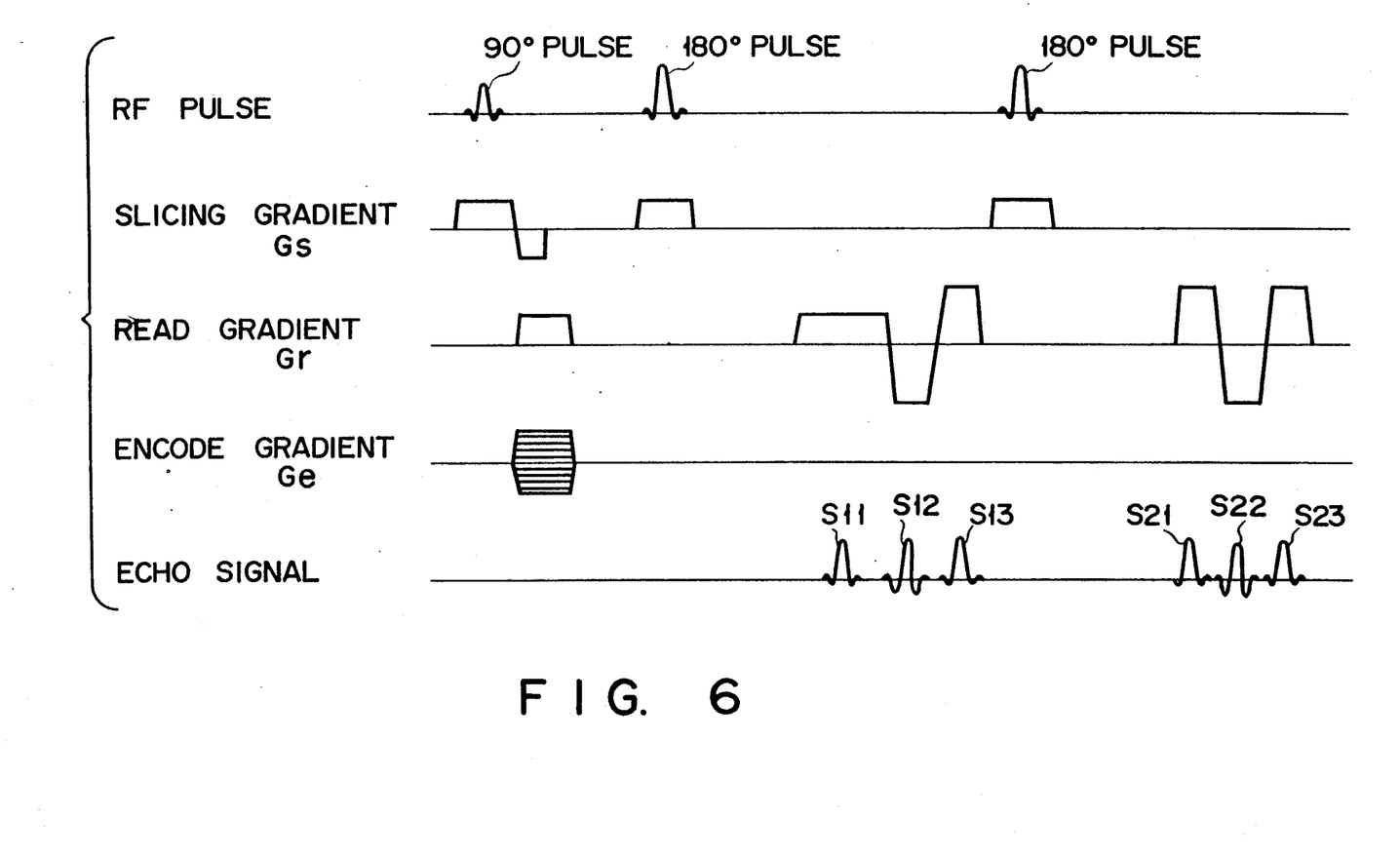
FIG. 6 is a view for explaining a pulse sequence of an MRI system according to a third embodiment of the present invention.

The third embodiment is associated with acquisition of a multi-echo signal according to the present invention, and a sequence of this embodiment is shown in FIG. 6.

Echo signals S11, S12, and S13 are added and averaged to obtain a first echo signal S1, and echo signals S21, S22, and S23 are added and averaged to obtain a second echo signal S2. The application times and strengths of the gradient fields Gr for obtaining the first echo signal S1 are different from those for obtaining the second echo signal S2.

A fourth embodiment of the present invention will be described below.

Figure 7:
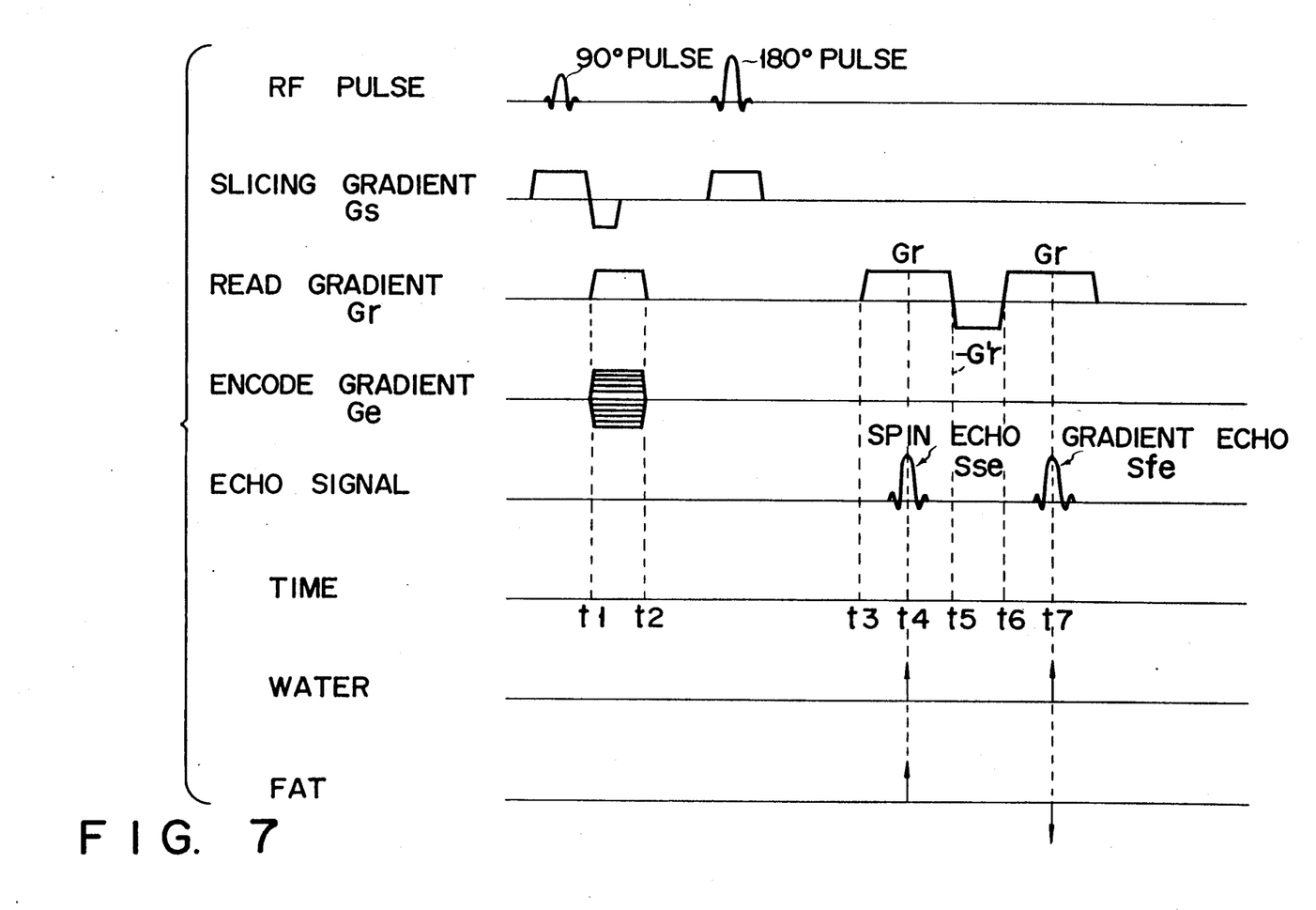
FIG. 7 is a view for explaining a pulse sequence of an MRI system according to a fourth embodiment of the present invention.

In the fourth embodiment of the present invention, some of a plurality of echoes generated upon inversion of the read gradient fields Gr are used to obtain two types of echoes, i.e., to realize a so-called Dixon method. A sequence of this embodiment is shown in FIG. 7.

The Dixon method will be described prior to a description of the sequence shown in FIG. 7.

A hydrogen atomic nucleus, i.e., a proton as a nucleus seed of interest will be taken into consideration. Most of the protons are contained in the molecules of water and fat. It is very significant to independently observe a water proton image (i.e., an image of protons contained in water) and a fat proton image (i.e., an image of protons contained in fat). These images can be separately extracted by utilizing chemical shift. A conventional technique for separately obtaining an image of protons contained in water and an image of protons contained in fat is known as a Dixon method (W. Thomas Dixon, Ph. D. "Simple Proton Spectroscopic Imaging", Radiography, 1984; 153: 189–194).

Figure 8:
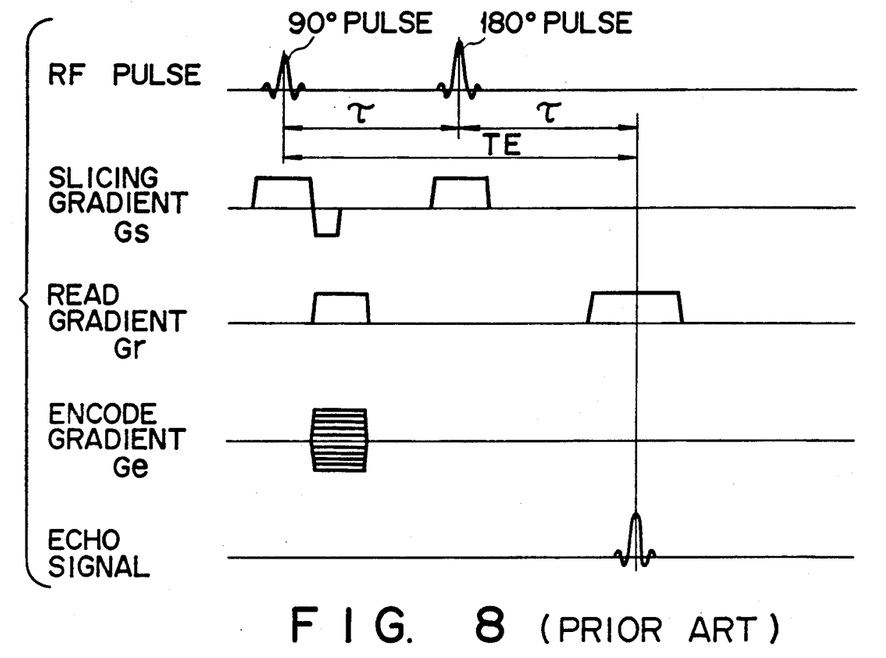
FIGS. 8 and 9 are views for explaining a pulse sequence of a so-called Dixon method as a method of the embodiment of FIG. 7.
Figure 9:
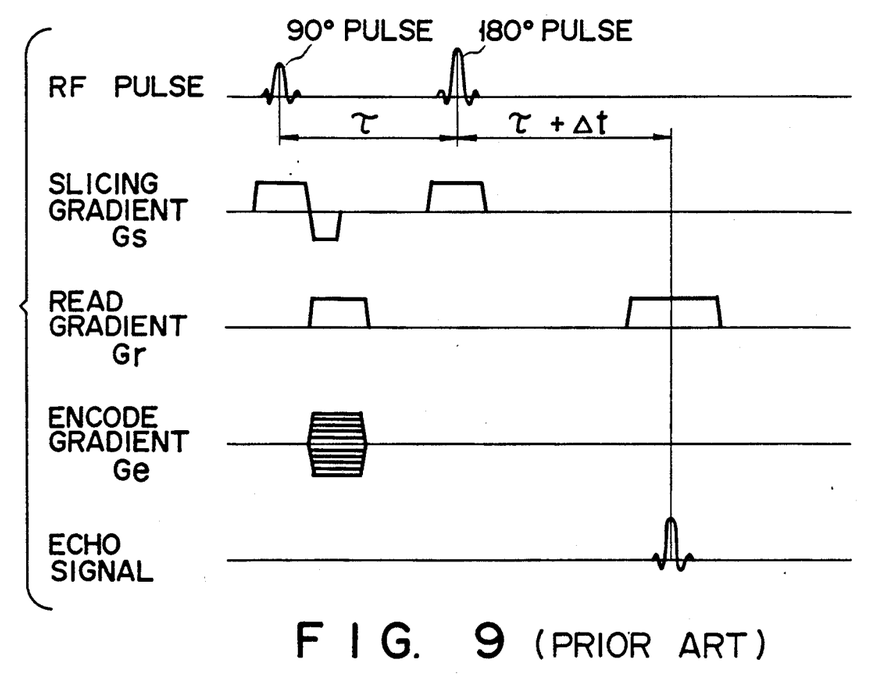

The timings of the RF pulses and the read gradient fields Gr are set such that a time during which the phases of water and fat proton signals match with each other coincides with the spin echo time TE in the sequence of FIG. 8. In the sequence shown in FIG. 9, the application timing of the 180° pulse is shifted from that of FIG. 8 by Δt so that the phases of the signals of the water and fat protons are shifted by 180°. A sum of and a difference between the echo signals obtained by the sequence of FIG. 8 and the echo signals obtained by the sequence of FIG. 9 are calculated to separately obtain the water and fat images.

According to the Dixon method, separate water and fat images can be obtained and result in clinical advantages. However, imaging must be repeated according to two independent sequences, resulting in a long imaging time.

According to a fourth embodiment of the present invention, a plurality of echoes generated upon inversion of the read gradient fields Gr are used to obtain two types of echoes for realizing the Dixon method.

That is, in the sequence shown in FIG. 7, magnetic resonance is excited in nuclear magnetization with the 90° pulse, and a spin echo signal is acquired by the 180° pulse to refocus the magnetization phases of the nuclear spins. Thereafter, the read gradient magnetic field Gr is inverted to acquire a field echo signal. At the same time, the application and inversion timings of the read gradient field are set such that the spin echo signals of water and fat are phase-matched, and the field echo signals of water and fat are 180° dephased.

As shown in FIG. 7, a time interval between times t1 and t5 represents a pulse sequence of a two-dimensional Fourier transform employing a conventional spin echo method. A spin echo signal appears at time t4. At this time, there is no phase difference in MR signals between the water protons and fat protons.

During a time period between times t4 and t5, phases of the nuclear magnetization components are shifted from each other. In order to rephase these components, a negative read gradient field $-Gr'$ is applied to the patient during a time period between times t5 and t6. After rephasing, a dephase gradient field $-Gr'$ is applied to disperse the nuclear magnetization phases. In order to match the dispersed phases, a positive read gradient field Gr is applied to the patient during a time period between times $t_6$ and $t_7$. In this case, the following equation must be satisfied:

$$\int_{t4}^{t5} Grdt + \int_{t6}^{t7} Grdt = \int_{t5}^{t6} Gr'dt \qquad 5$$

In the field echo method using the gradient field Gr, a phase difference is present between the water and fat signals. The phase difference $\phi$ is defined as follows:

$$\phi = 2\pi\gamma \cdot \delta \cdot B0(t7-t4) \quad [rad]$$

where is the chemical shift amount, B0 is the static field strength, and $\gamma$ is the gyromagnetic ratio. If a time interval (t7−t4) is determined to satisfy $\phi=180°$, a phase difference of 180° occurs between the signal from the water protons and the signal from the fat protons. Alternatively, $\phi=n\times 180°$ (n is an odd number) may be established.

When times t7 and t4 are determined to satisfy $\phi=180°$, a signal from only water protons can be obtained by Sse+Sfe, and a signal from only the fat protons can be obtained by Sse−Sfe by using spin echo signals Sse and Sfe. When image reconstruction is performed by using the resultant signals, separate water and fat images can be obtained by one imaging sequence. The S/N can be improved by approximately tely $\sqrt{2}$.

In this case, image reconstruction is performed using only Sse, and then the next image reconstruction is performed using only Sfe. The resultant images are processed to obtain separate water and fat images.

According to this embodiment, two types of MR echo signals for obtaining separate water and fat images can be obtained by one imaging sequence. The sequence based on the same technique as in this embodiment for obtaining separate images of two substances having slightly different magnetic resonance frequencies by chemical shift can be used in addition to reconstruction of the separate water and fat images.

The present invention is not limited to the particular embodiments described above. Various changes and modifications may be made within the spirit and scope of the invention.

What is claimed is:

1. A magnetic resonance imaging system comprising:
    static magnetic field generating means for generating a homogeneous static magnetic field in a predetermined imaging volume in which an object to be examined is placed;
    gradient magnetic field applying means for applying a gradient magnetic field to the imaging volume;
    RF pulse applying means for applying an RF pulse to the imaging volume;
    sequence control means for controlling said gradient magnetic field applying means and said RF pulse applying means in accordance with a predetermined sequence so as to cause said gradient magnetic field applying means and said RF pulse applying means to respectively apply a predetermined gradient magnetic field and RF pulses to the imaging volume, thereby causing a magnetic resonance phenomenon in the imaging volume;
    receiving means for receiving a magnetic resonance signal generated in the imaging volume by the magnetic resonance phenomenon;
    imaging processing means for obtaining a magnetic resonance image by performing predetermined processing including image reconstruction processing for the magnetic resonance signal received by said receiving means,
    said sequence control means including first means for driving said RF pulse applying means to cause magnetic resonance excitation, second means for driving at least one of said RF pulse applying means and said gradient magnetic field applying means to produce a magnetic resonance echo, third means for driving said gradient magentic field applying means during reception of the magnetic resonance echo to apply a read gradient field to the imaging volume, sand fourth means for driving said gradient magnetic field applying means to generate at least one additional magnetic resonance echo by inverting the read gradient field at least once, thereby applying an inverted gradient field to the imaging volume,
    said receiving means including echo processing means for processing data of a plurality of magnetic resonance echoes;
    wherein said echo processing means includes adding means for adding and averaging the data of the plurality of magnetic resonance echoes; and
    wherein said adding means includes means for inverting magnetic resonance echo data produced by the inverted read gradient field on a frequency axis to add the magnetic resonance echo data.

2. A system according to claim 1, wherein said first means includes means for causing said RF pulse applying means to generate a 90° selective excitation pulse and causing said gradient magnetic field, applying means to generate a gradient magnetic field for slicing.

3. A system according to claim 1, wherein said second means includes means for causing said RF pulse applying means to generate a 180° selective excitation pulse and causing said gradient magnetic field, applying means to generate a gradient magnetic field for slicing.

4. A system according to claim 1, wherein said second means includes means for causing said gradient magnetic field applying means to generate the read gradient field and for inverting the read gradient field.

5. A system according to claim 1, wherein said second means has timings of application of the RF pulses or inversion of the gradient fields such that nuclear magnetization phases of two substances having slightly different resonance frequencies caused by chemical shift match with each other at the time of generation of the magnetic resonance echo, said fourth means has an inversion timing of the read gradient field such that the nuclear magnetization phases of the two substances are opposite to each other at the time of generation of the magnetic resonance echo, and said echo processing means performs at least one of an addition and a subtraction of the echo data generated by said second means to and from the echo data generated by said fourth means.

6. A magnetic resonance imaging system comprising:
    static field generating means for generating a homogeneous static magnetic field in a predetermined imaging volume in which an object to be examined is placed;
    gradient magnetic field applying means for applying a gradient magnetic field to the imagnig volume;
    RF pulse applying means for applying an RF pulse to the imaging volume;
    sequence control means for controlling said gradient magnetic field applying means and said RF pulse applying means in accordance with a predetermined sequence so as to cause said gradient magnetic field applying means and said RF pulse applying means to respectively apply a predetermined gradient magnetic field and RF pulses to the imaging volume, thereby causing a magnetic resonance phenomenon in the imaging volume;

receiving means for receiving a magnetic resonance signal generated in the imaging volume by the magnetic resonance phenomenon;

imaging processing means for obtaining a magnetic resonance image by performing predetermined processing including image reconstruction processing for the magnetic resonance signal received by said receiving means, said sequence control means including first means for driving said RF pulse applying means to cause magnetic resonance excitation, second means for driving at least oen fo said RF pulse applying means and said gradient magnetic field applying means to produce a magnetic resonance echo, third means for driving said gradient magnetic field applying means during reception of the magnetic resonance echo to apply a read gradient field to the imaging volume, and fourth emans for driving said gradient magnetic field applying means to generate at least one additional magnetic resonance echo by inverting the read gradient field at least once, thereby applying an inverted gradient field to the imaging volume, and said imaging processing means including echo processing means for processing image data derived from a plurality of magnetic resonance echoes;

wherein said echo processing means includes adding means for adding and averaging the plurality of magnetic resonance echo data; and wherein said adding means includes means for inverting image data of the magnetic resonance echo produced by the inverted read gradient field on a frequency axis to add the image data.

7. A system according to claim 6, wherein said first means includes means for causing said RF pulse applying means to generate a 90° selective excitation pulse and causing said gradient magnetic field, applying means to generate a gradient magnetic ,field for slicing.

8. A system according to claim 6, wherein said second means includes means for causing said RF pulse applying means to generate a 180° selective excitation pulse and causing said gradient magnetic field, applying means to generate a gradient magnetic field for slicing.

9. A system according to claim 6, wherein said second means includes means for causing said gradient magnetic field applying means to generate the read gradient field and for inverting the read gradient field.

10. A system according to claim 6, wherein said second means has timings of application of the RF pulses or inversion of the gradient fields such that nuclear magnetization phases of two substances having slightly different resonance frequencies caused by chemical shift match with each other at the time of generation of the magnetic resonance echo, said fourth means has an inversion timing of the read gradient field such that the nuclear magnetization phases of the two substances are opposite to each other at the time of generation of the magnetic resonance echo, and said echo processing means performs at least one of an addition and a subtraction of the echo data generated by said second means to and from the echo data generated by said fourth means.

11. A method of imaging a magnetic resonance image by applying a predetermined gradient field and an RF pulse to a predetermined imaging volume of an object to be examined in a static field, causing a magnetic resonance phenomenon in a predetermined portion within the iamging volume, receiving a magnetic resonance signal generated by the magnetic resonance phenomenon, and performing predetermined processing including image reconstruction processing, including the steps of:

the first step of applying the RF pulse to the imaging volume to cause magnetic resonance excitatino;

the second step of applying at least oen of the RF pulse and the gradient field to produce a magnetic resonance echo;

the third step of applying a read magnetic field to the imaging volume during reception of the magnetic resonance echo;

the fourth step of inverting the read gradient field at least once to apply the inverted read gradient field to the imaging volume so as to produce at least one additional magnetic resonance echo;

the fifth step of processing data of a plurality of magnetic resonance echoes;

wherein the fifth step includes the sixth step of adding and averaging the data of the plurality of magnetic resonance echoes; and wherein the sixth step includes the step of inverting magnetic resonance echo data generated by the inverted read gradient field on a frequency axis and adding the magnetic resonance echo data.

12. A method according to claim 11, wherein the first step uses a 90° selective excitation pulse as the RF pulse.

13. A method according to claim 11, wherein the second step uses a 180° selective excitation pulse as the RF pulse.

14. A method according to claim 11, wherein the second step has timings of application of the RF pulses or inversion of the gradient fields such that nuclear magnetization phases of two substances having slightly different resonance frequencies caused by chemical shift match with each other at the time of generation of the magnetic resonance echo, the fourth step has an inversion timing of the read gradient field such that the nuclear magnetization phases of the two substances are opposite to each other at the time of generation of the magnetic resonance echo, and the fifth step performs at least one of an addition and a subtraction of the echo data generated by the second step to and from the echo data generated by the fourth step.

* * * * *